United States Patent [19]

Rockstad et al.

[11] 3,983,076
[45] Sept. 28, 1976

[54] N-TYPE AMORPHOUS SEMICONDUCTOR MATERIALS

[75] Inventors: Howard K. Rockstad, Troy; Richard A. Flasck, Pontiac Township, both of Mich.

[73] Assignee: Energy Conversion Devices, Inc., Troy, Mich.

[22] Filed: July 2, 1973

[21] Appl. No.: 375,794

[52] U.S. Cl. ............................ 252/518; 106/47 R
[51] Int. Cl.² ................... H01B 1/06; C03C 3/12; C03C 3/30
[58] Field of Search ............ 106/47 R, 47 Q; 252/501, 512, 62.1, 62.3 R, 300, 578; 96/1.5; 117/201, 33.3, 106 A; 350/1

[56] References Cited
UNITED STATES PATENTS

| | | | |
|---|---|---|---|
| 3,343,972 | 9/1967 | Hilton et al. | 106/47 R |
| 3,348,045 | 10/1967 | Brau et al. | 106/47 R |
| 3,360,649 | 12/1967 | Brau et al. | 106/47 R |
| 3,440,068 | 4/1969 | Patterson et al. | 106/47 R |
| 3,451,794 | 6/1969 | Patterson | 106/47 R |
| 3,511,993 | 12/1970 | Patterson | 106/47 R |
| 3,709,813 | 1/1973 | Johnson et al. | 106/47 R |
| 3,771,073 | 11/1973 | Krause | 106/47 R |
| 3,773,529 | 11/1973 | Schottmiller | 106/47 X |
| 3,820,968 | 6/1974 | Haisty | 106/47 R |

OTHER PUBLICATIONS

Hilton et al.—"Non-Oxide IVA–VA–VIA Chalcogenide Glasses", Parts I, II, III—Phys. & Chem. of Glasses, 7(4) Aug. 1966, pp. 105–126.

*Primary Examiner*—Winston A. Douglas
*Assistant Examiner*—Mark Bell
*Attorney, Agent, or Firm*—Wallenstein, Spangenberg, Hattis & Strampel

[57] ABSTRACT

New amorphous semiconductor and chalcogenide compositions are provided exhibiting n-conductivity characteristics. Chalcogenide compositions, which are normally formed as p-type materials, are converted to n-type materials or are initially formed as n-type materials, by elevating the temperatures thereof below their crystallization temperature and substantially in excess of the temperature at which its conductivity at room temperature versus annealing temperature curve decreases sharply from a relatively high constant value and allowing the same to cool to room temperature.

10 Claims, 17 Drawing Figures

ISORESISTIVITY CURVES
(OHM-CM)

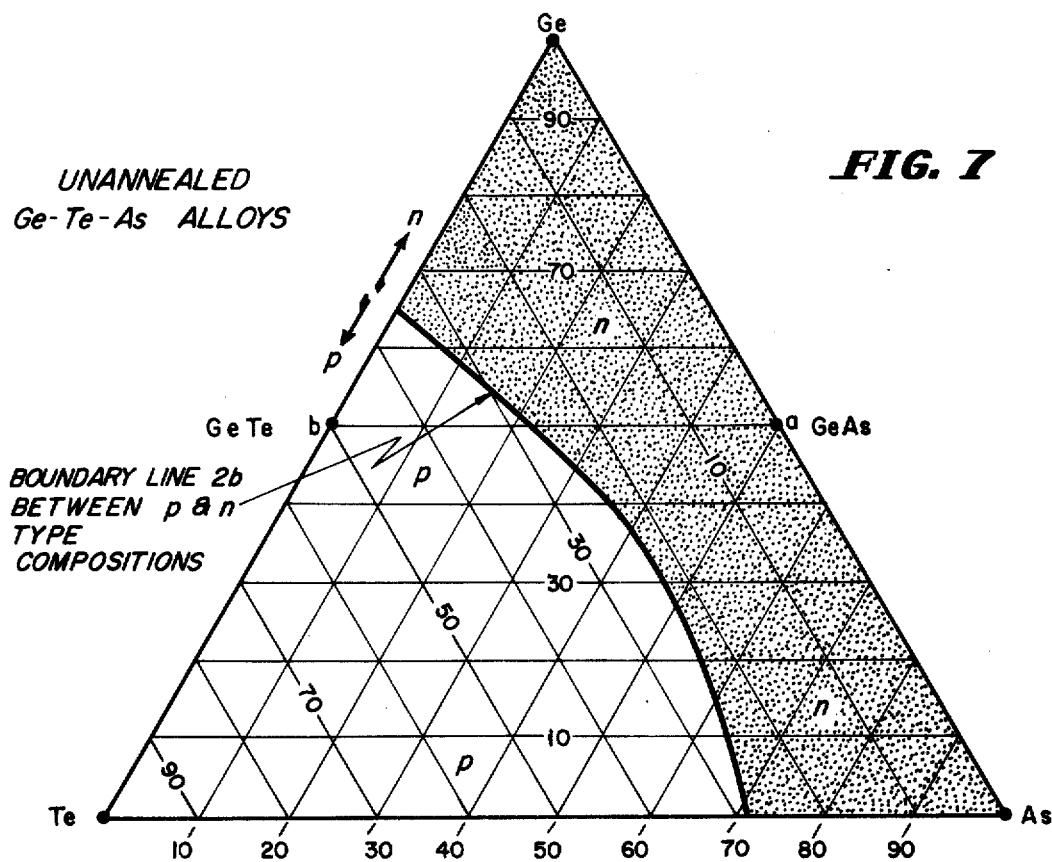
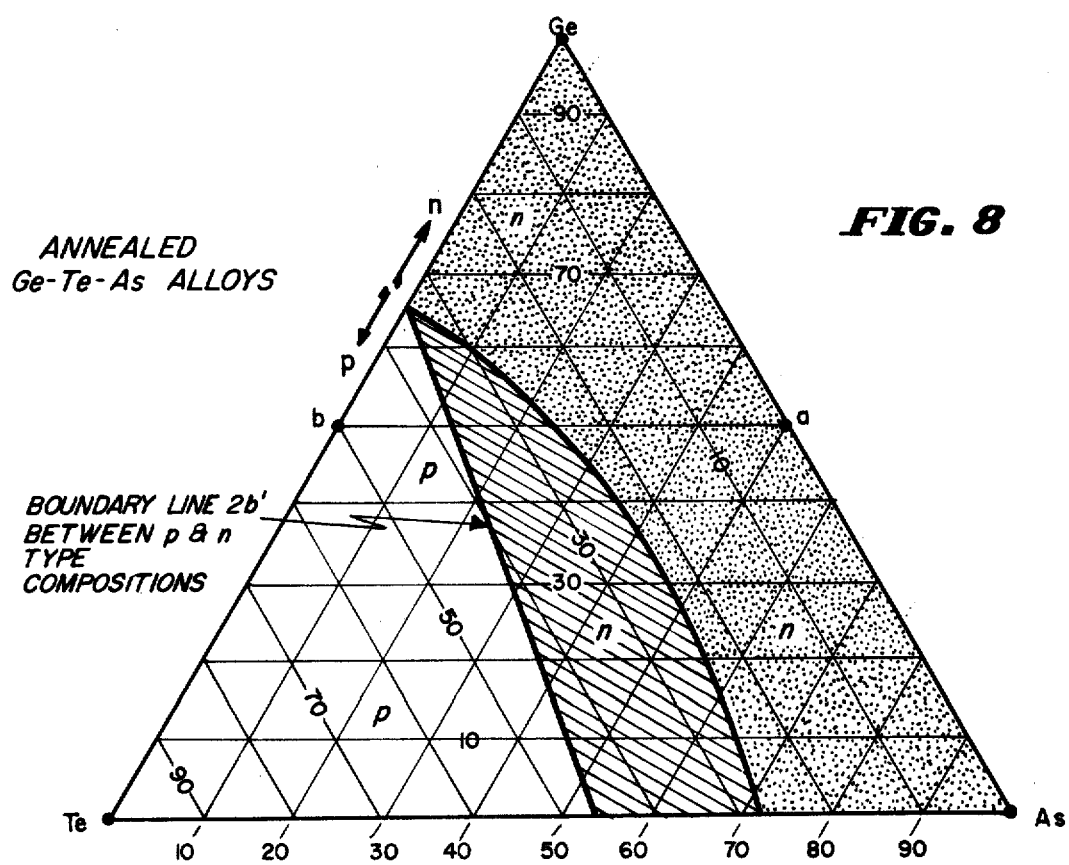

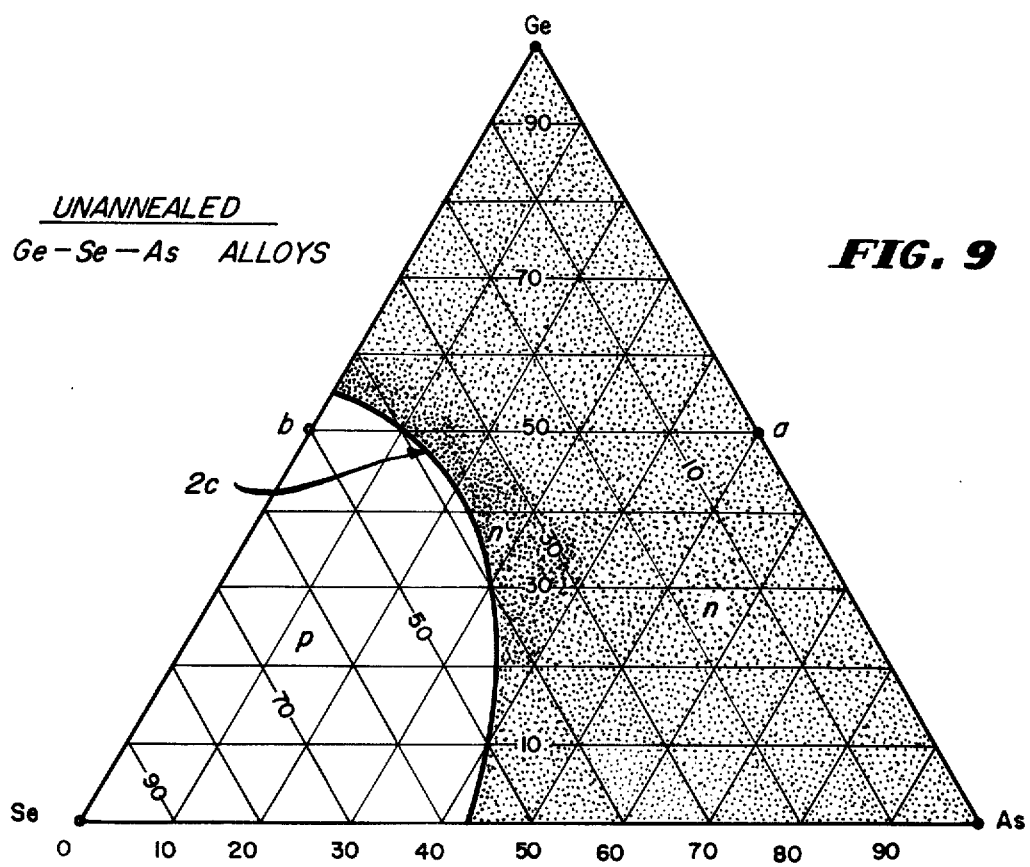
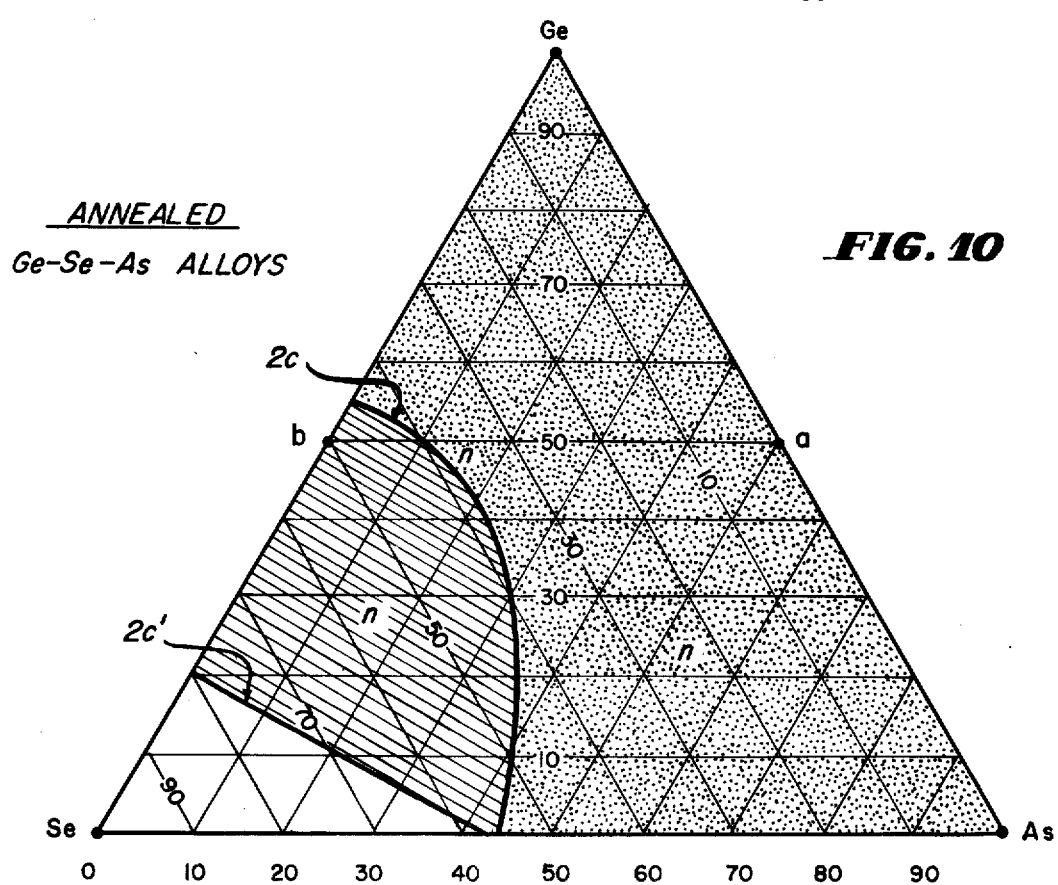

UNANNEALED Ge—Se—Sb ALLOYS

ANNEALED Ge-Se-Sb ALLOYS

3,983,076

N-TYPE AMORPHOUS SEMICONDUCTOR MATERIALS

The invention herein described was made in the course of or under a contract with the Department of Defense of the U.S. Government.

BACKGROUND OF THE INVENTION

The present invention relates to chalcogenide amorphous semiconductor materials, their application to the making of current control devices and methods of making the same. In this context, chalcogenide materials are construed as materials containing at least 2 percent of one or more of the chalcogenide elements, sulfur, selenium or tellurium.

Chalcogenide amorphous semiconductor materials have been used in recent years for the manufacture of two types of switching devices, one of which devices is sometimes referred to as a threshold switch device and the other of which is sometimes referred to as a memory switch device. Such devices are disclosed in U.S. Pat. No. 3,271,591 to S. R. Ovshinsky granted Sept. 6, 1966. When a film of such chalcogenide material is sandwiched between or extends between two suitable electrodes, the application of electrical pulses of the correct energy time profile can cause the structure to display either a high or a low resistance, with a resistance ratio at least from about $10^3$ to $10^4$. In its high resistance or relatively non-conductive state, these devices have resistivities in the range from about $10^3$ to $10^{12}$ ohm-centimeters, and in their low resistance or conductive states they commonly have resistivities in the range of from about 10 to $10^{-6}$ ohm-centimeters.

The threshold switch devices are driven into a low resistance or conductive state by a voltage in excess of a given threshold voltage value and remain in their conductive states until the current flow therethrough drops below a given holding current value. Examples of chalcogenide materials used in threshold switch devices include compositions of (a) 40% tellurium, 35% arsenic, 18% silicon, 6.75% germanium and 0.25% indium; and, (b) 28% tellurium, 34.5% arsenic, 15.5% germanium and 22% sulfur.

Memory switch devices are driven into a low resistance or conductive state by a voltage in excess of a given threshold voltage value and remain in their conductive states even after all sources of energy are removed therefrom, and are resettable to their relatively non-conductive state by application of a reset pulse, as explained in the aforesaid U.S. Pat. No. 3,271,591. The voltage pulse which sets a memory device-forming material is generally a pulse of milliseconds duration. A reset pulse is a very short current pulse lasting generally less than about 6 microseconds in duration. Memory switch semiconductor materials are vitreous semiconductor materials which are reversibly changed between two stable structural states generally between relatively dis-ordered or amorphous and relatively ordered crystalline states. Their compositions are at the border of the glass regions, and are generally binary compositions of tellurium and germanium with germanium comprising generally greater than 10% of the composition or compositions like this including additional elements of group V or VI of the periodic table. Examples of memory material compositions are (a) 15% (atomic) germanium, 81% tellurium, 2% antimony and 2% sulfur; and (b) 83% tellurium and 17% germanium.

The useful chalcogenide compositions used in making threshold and memory switch devices have been materials which have had p-type conductivity, as generally indicated by a positive thermopower or Seebeck coefficient measurement. (The designation of a material as an n-type conductivity material in the semiconductor art generally refers to a material which has electrons as majority current carriers rather than holes characteristic of p-type conductivity materials.) The conductivity type of chalcogenide materials used to make threshold or memory switch devices was not considered to be of any real significance, since the threshold and semiconductor switch devices referred to are not p-n junction devices like transistors where successive layers of different conductivity type are associated together to form an amplifier device or the like. However, it has been recently proposed to make two and three terminal devices from chalcogenide compositions to form rectifiers and transistors, where the particular conductivity type of the material involved can be of significance.

While it was sometimes heretofore stated that it was believed that n-type chalcogenide materials existed or could be made prior to the present invention, specific n-type chalcogenide compositions were not reported and chalcogenide materials were generally thought to be p-type materials. Also, while some experimental work has heretofore been carried out in testing various electrical characteristics of germanium-tellurium binary compositions of varying percentages of these two elements, measurements were not reported from which it could be determined whether any of these compositions were of the p or n conductivity type. However, applicants have taken measurements of such binary compositions and found that within the range of compositions of these two elements useable in making memory switch devices (namely where tellurium constituted 35–95% of the binary composition), the material is of the p-type. It was discovered, however, that this binary composition is of the n-type for tellurium percentages in the range of from near 0 to near 35%. The resistivities of these n-type germanium-tellurium compositions are of from very low to modest magnitudes, making them suitable as layers for junction devices where low resistivities are desirable. (However, all switch device-forming chalcogenide compositions will generally be in a useful low resistance state to form satisfactory two and three terminal p-n junction devices in their switched conductive state even when their unswitched high resistance state has a high resistivity.)

A useful feature of some of these new n-type amorphous chalcogenide compositions is that some of them have significantly lower resistivities at room temperature than resistivities reported before by other workers testing resistivities of amorphous germanium of the n conductivity type. Thus, it was discovered that some of these new alloys of germanium with small amounts of chalcogenide materials were fabricated having lower resistivities than germanium itself.

SUMMARY OF THE INVENTION

In accordance with one of the features of the invention, unique and useful n-type amorphous chalcogenide compositions not heretofore used in the making of the threshold and memory switch devices referred to are obtained by vapor or sputter depositing on a substrate, held at such modest temperatures as 70° or 80° C and lower temperatures, various specific amorphous chalcogenide compositions not heretofore fabricated. Such compositions will be more fully disclosed hereinafter.

In accordance with another feature of the invention, we have discovered that many chalcogenide compositions having a p-conductivity type when deposited on a substrate at a modest temperature, like the p-type compositions used to make threshold switch devices as described, can be converted to a unique useful state for which the material is still amorphous but the conductivity is n-type. This p-type to n-type transformation is accomplished by annealing the material at a desired elevated temperature which is below the crystallization temperature thereof and substantially in excess of the temperature at which the conductivity at room temperature versus annealing temperature curve thereof decreases sharply from a relatively high value flat portion of the curve. Thus, if the temperature of such a normally p-type amorphous chalcogenide composition is repeatedly raised to various progressively increasing temperatures and held at such temperature for a given period (e.g. 5 minutes) and then returned to a reference temperature like 25° C where the resistance thereof is measured, a curve can be drawn of conductivity versus the annealing temperature involved. When a temperature is reached at which the conductivity starts to sharply decrease, measurements are taken to determine whether the material is of a p or n-type. (One conventional way of determining whether a composition is p or n-type is a thermopower or Seebeck coefficient measurement where the materials thermoelectric voltage versus the temperature difference producing the voltage is plotted. A p-type conductivity is indicated by a positive slope in the above plot and an n-type conductivity is indicated by a negative slope). It is observed that as the annealing temperature is raised in the region where the conductivity sharply decreases as explained, the degree of p conductivity will progressively decrease until a temperature is reached where a weak n-conductivity composition is obtained. Then, as the annealing temperature is increased further, the degree of n conductivity progressively increases to a maximum at a given annealing temperature value. Temperatures of the order of magnitude of from 200° to 400° C were generally required to maximize the n-type character where these temperatures were maintained for five minutes. It should be understood that annealing effects are both time and temperature dependent, so that a given annealing effect could be achieved at somewhat lower than a given temperature if the composition involved is held at that lower annealing temperature for a longer time.

Instead of obtaining an n-conductivity amorphous chalcogenide material from an initially p-type material by the annealing procedure just outlined, a similar result can be achieved by heating the substrate upon which the composition is sputter or vapor deposited to the elevated temperature which was the annealing temperature for the composition involved which produced an n-type composition in the annealing process described, and then allowing the same to cool to room temperature. However, this would require sputtering apparatus capable of maintaining substrates at relatively high temperatures, which may not be as practical or feasible as initially depositing the chalcogenide glass compositions as p-type compositions and then, in a separate annealing furnace, carrying out the desired annealing process.

Many of the amorphous chalcogenide materials produced by the temperature elevating or annealing processes produce a high resistivity n-type amorphous semiconductor material which could be used in making threshold switch devices and also making use of its n-type character in the high resistance state through the electronic interaction of this layer with the other layers where a high resistivity is needed or is of no consequence. For example, base layers in p-n-p devices can be so thin that a high resistivity will have no adverse effect. The n-type amorphous chalcogenide compositions of the invention also provide compositions of low resistivity. Examples of applications for low resistivity n-type material are as cathode or anode layers in p-n rectifier devices or as emitter and collector as well as base electrode-forming layers in amplifier transistor-like devices. (However, the layers used in such junction devices can also have high resistivities provided they are used in their low resistance switched state.)

In the past, since amorphous semiconductor materials were known as p-type, they have appeared unsuitable for any of the above mentioned devices requiring the presence of both p and n type regions. Hence, the n-type materials described herein opens up applications for active devices consisting of n and p-type regions of amorphous semiconductors. The advantage of using p and n-type amorphous chalcogenide films to make p-n junction devices is that these devices can be inexpensively mass produced by a simple film deposition process and they are radiation hard so the devices will operate effectively in the presence of ionizing and neutron radiation, unlike conventional semiconductor devices like transistors made of crystalline semiconductor compositions.

In accordance with another aspect of the invention, p-n junction amorphous semiconductor devices replacing crystalline p-n junction devices are mass produced by film depositing techniques replacing the more cumbersome processes used to make p-n crystalline junction devices like transistors and the like. Thus, p-n junctions can be formed by sputter or vapor deposition an amorphous chalcogenide layer which is initially formed as an n-type material or is formed n-type by annealing the same, and sputter depositing a p-type layer over the n-type layer or vice versa.

The various n-type chalcogenide compositions have at least about 2% of one or more of the chalcogenide elements of sulfur, selenium and tellurium and with which the present invention deals can generally be identified by the following formula (although this formula also includes compositions which are p-type):

$$Ge_xTe_yD_zE_m$$

where,
Ge=germanium
Te=tellurium
D=selenium or sulfur or combinations of both
E=arsenic or antimony or combinations of both
and,
$x$ is between and including 0 and 98% (atomic)
$y$ is between and including 0 and 90%
$z$ is between and including 0 and 75%
$m$ is between and including 0 and 98%

For n-type materials, the percentage limits on a given component depend in a complex way on the relative percentages of the other components. New n-type amorphous chalcogenide compositions are covered by the above formula where if tellurium or germanium is present there is present also significant amounts (e.g. about 2 percent or more) of one or more of the D and E elements.

Specific examples of these materials and specific processes for making the same will be later described.

DESCRIPTION OF DRAWINGS

FIG. 7 is a ternary diagram for various compositions of germanium, tellurium and arsenic and shows in the stippled areas thereof those compositions which have an n-conductivity type in their unannealed state;

FIG. 8 is a ternary diagram corresponding to FIG. 7 which indicates in the hatched areas thereof those compositions which are converted to an n-conductivity type by the annealing process of the invention;

FIG. 9 is a ternary diagram for germanium, selenium and arsenic compositions and shows in the stippled areas thereof those compositions which have an n-conductivity type in the unannealed state thereof;

FIG. 10 is a ternary diagram corresponding to FIG. 9 and shows in the hatched areas thereof compositions which are converted to an n-conductivity type by the annealing process of the invention;

Figure 1:
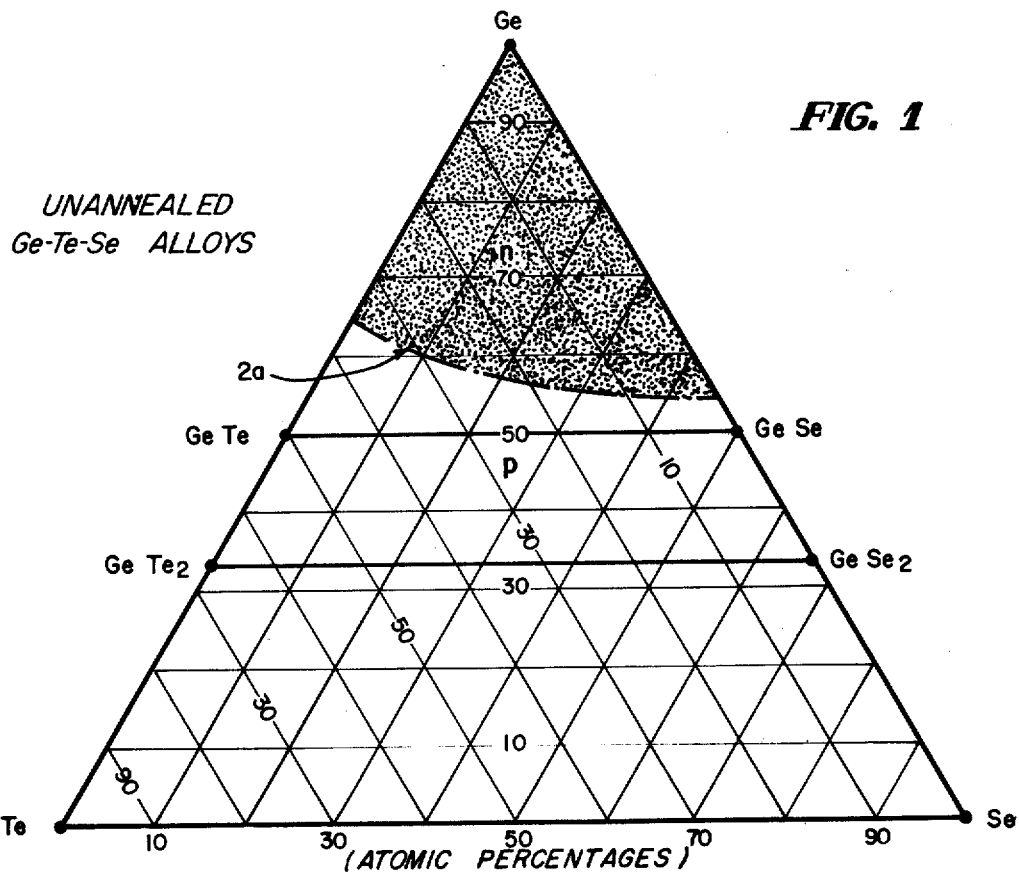
FIG. 1 is a ternary diagram of germanium (Ge), tellurium (Te), and selenium (Se) compositions based on atomic percentages of these elements, the stippled areas thereof indicating those compositions having an n-conductivity type in an unannealed state.

Refer now to FIG. 1 which shows Ge-Te-Se compositions sputter or vapor deposited upon a substrate held at modest temperatures, for example, temperatures commonly used in sputtering equipment which are at or below about 70°C. (While sputter deposition is preferred, these films can also be made by vapor deposition.) The compositions shown in the stippled areas are unexpectedly deposited as n-conductivity materials as measured by the Seebeck coefficient measurements. Boundary line 2a in FIG. 1 separates the stippled n-conductivity type compositions from those which are deposited in their p-conductivity state. As previously indicated, (except for the binary compositions of germanium and tellurium) the various compositions shown as having n-conductivity states are not believed to have been heretofore fabricated, and the Ge-Te binary compositions which were fabricated were probably not known to have been of an n-conductivity type since it was previously thought that these chalcogenide glass compositions were of the p-conductivity type.

Figure 2:
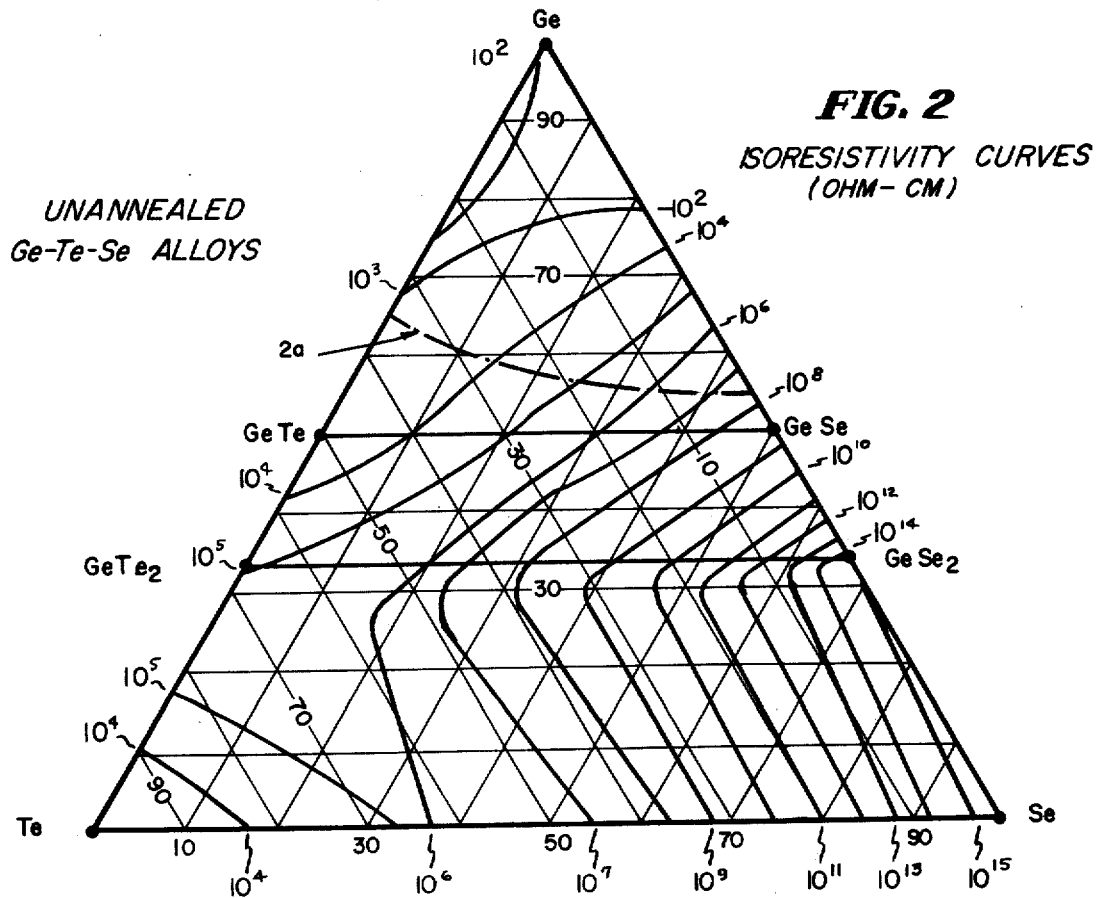
FIG. 2 is a ternary diagram corresponding to FIG. 1 with isoresistivity lines thereon showing the resistivity of the various compositions depicted therein.

FIG. 2, which illustrates the resistivities of the various compositions of FIG. 1, shows that the unannealed compositions rich in germanium and tellurium have relatively low resistivities which increase in the direction of the compositions which are rich in selenium.

Figure 3:
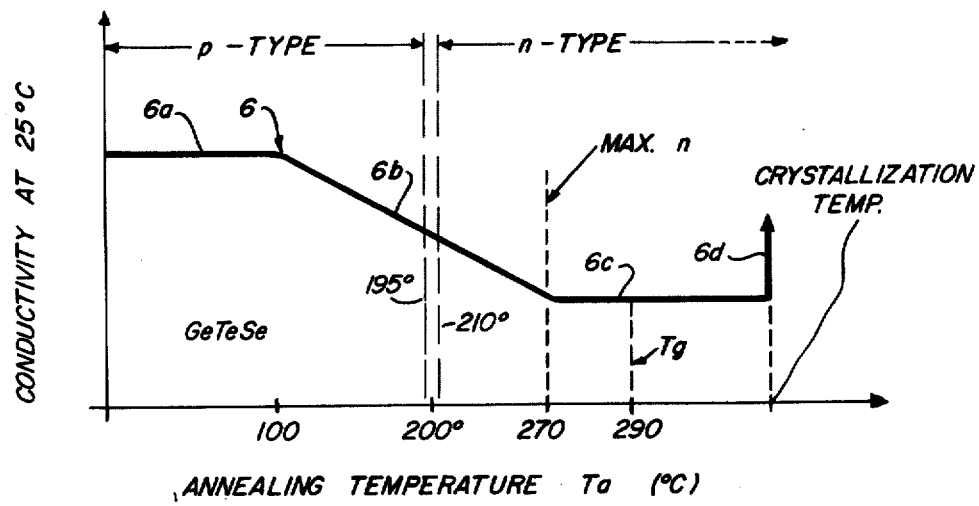
FIG. 3 is a curve showing the conductivity at room temperature of the composition GeTeSe (which is p-type in its unannealed state) for various progressively increasing annealing temperatures.

In accordance with the method aspect of the invention, it was discovered that many of the compositions which are of the p-conductivity type in FIG. 1 can be converted into the n-type region or formed as n-conductivity type materials by elevating the same to a temperature which can be determined in a manner illustrated in FIG. 3, and then allowing the same to cool to room temperature. First, of all, a film of the composition involved is heated to a test temperature which is maintained for a given test period (e.g. 5 minutes), and then is allowed to cool to room temperature, at which the resistivity and Seebeck coefficient is measured. This procedure is repeated at various progressively increasing test temperatures. As shown in FIG. 3 for the particular composition of GeTeSe, the conductivity at room temperature of the annealed composition remains substantially constant as indicated by curve portion 6a. However, for annealing temperatures in excess of about 110° C, the conductivity starts sharply to decrease to form an inclined curve portion 6b which terminates in a horizontal curve portion 6c at an annealing temperature of about 270° C. No further significant changes in room temperature conductivity occur for annealing temperatures in excess of 270° C, until the annealing temperature reaches the crystallization temperature where the conductivity suddenly increases as indicated by curve portion 6d. The glass transition temperature $T_g$ of 290° C for this composition is at a point along the horizontal curve portion 6c.

While the conductivity of the material decreases along the inclined curve portion 6b, the Seebeck coefficient (which is a measure of its conductivity type) progressively decreases from a given positive value to a value of 0 at an annealing temperature of about 195°C.

At an annealing temperature of about 210°C., the Seebeck coefficient turns negative (indicating n-conductivity material) and progressively increases reaching an approximate maximum n-type value at an annealing temperature of about 270°C, which is about at the point where the inclined curve portion 6a joins the relatively flat curve portion 6c.

Figure 4:
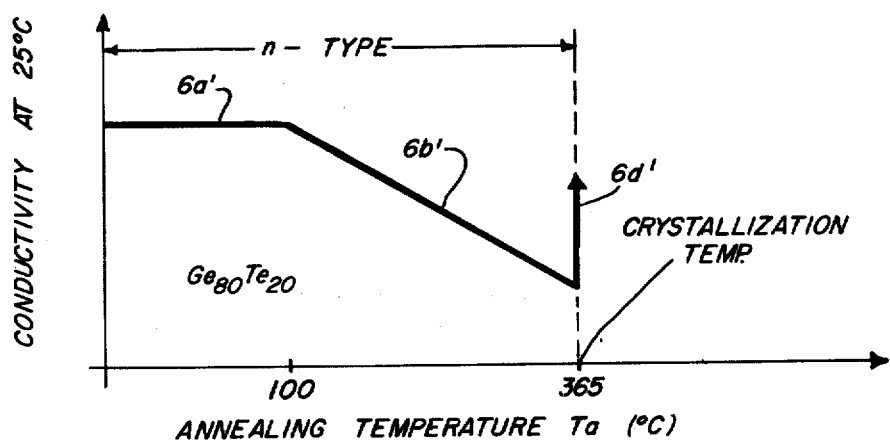
FIG. 4 is a curve showing the variation in conductivity at room temperature with progressively increasing annealing temperatures of the composition $Ge_{80}Te_{20}$ (which is n-type in its unannealed state)

FIG. 4 illustrates the room temperature conductivity versus the annealing temperature curve for compositions rich in germanium such as $Ge_{80}Te_{20}$, which are formed in their n-conductivity state in their unannealed state (and so fall in the stippled area of FIG. 1). During the annealing process, the n-conductivity state of such a material remains and it will be noted that the conductivity at room temperature remains substantially flat as indicated by curve portion 6a' until an annealing temperature is reached where the conductivity curve suddenly starts to progressively decrease along an inclined curve portion 6b'. The inclined curve portion 6b' terminates at the crystallization temperature for the composition involved, there being no $T_g$ therefore.

Figure 5:
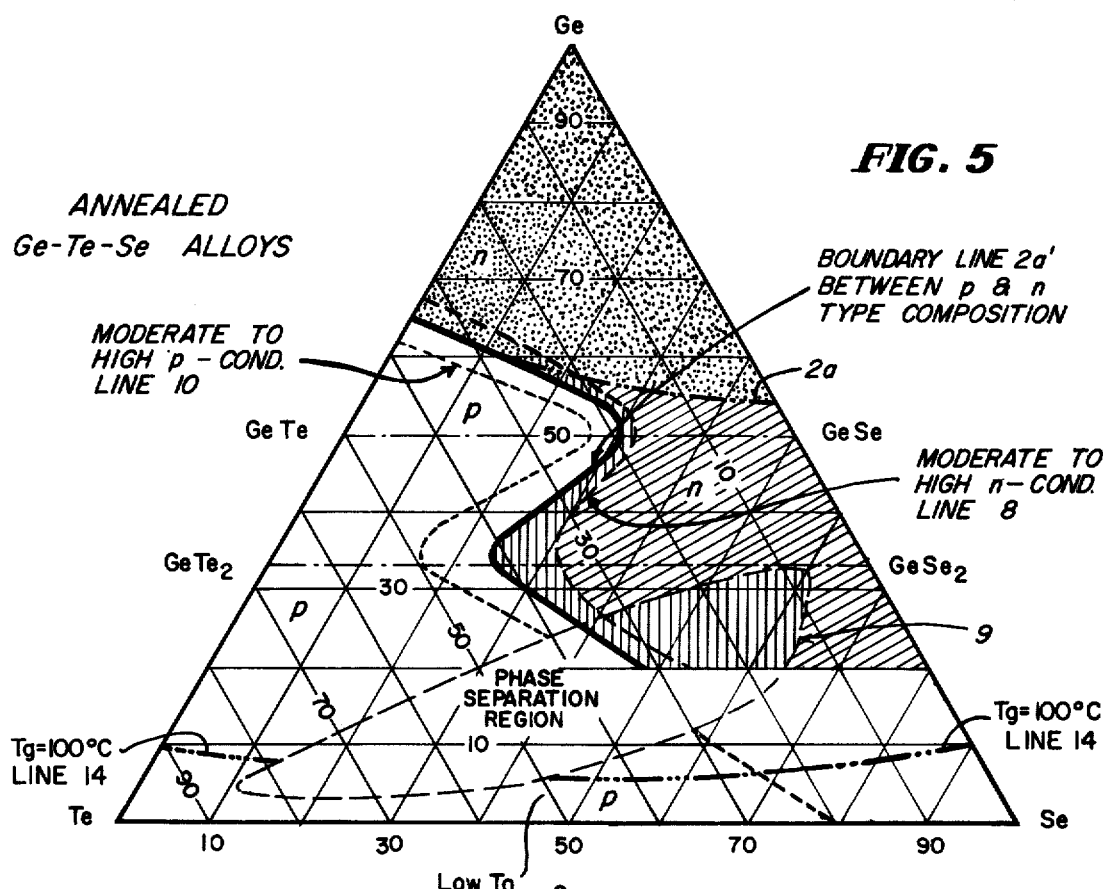
FIG. 5 is a ternary diagram of the compositions of FIGS. 1 and 2 and shows in the various hatched areas thereof those compositions which are converted to an n-conductivity type when annealed in accordance with the invention, the inclined hatched areas having a substantial n-conductivity and being homogeneous compositions which have a substantial glass transition temperature (100° C and higher), and the stippled areas thereof indicating those compositions having an n-conductivity type whether the materials are unannealed or annealed.

FIG. 5 indicates the results of the annealing process described applied to all of the Ge-Te-Se compositions of FIG. 1. Those compositions shown in FIG. 5 by hatched areas are those compositions which are converted from a p-conductivity state to an n-conductivity state by annealing. The solid boundary line 2a' separates compositions having n and p-conductivity states. The boundary line 8 separates compositions having moderate to strong n-type behavior (that is the negative Seebeck coefficients are at least about 0.5 millvolt/° C) from those having weak n-type behavior. Those compositions identified by vertical hatched areas have either relatively small n-conductivity characteristics or are commercially inacceptable for most applications either because the annealed composition is non-homogeneous because of separation into different phases or have glass transition temperatures of modest value (i.e. at or below about 100° C). The endless line 9 encloses the compositions which are non-homogeneous. Those compositions encompassed by inclined hatch lines extending upwardly to the right are the most desirable n-type compositions in that they are homogenous, have substantial negative Seebeck coefficient values and have glass transition temperatures above 100° C.

FIG. 5 also shows a boundary line 10 separating those compositions to the left of the line which have moderate to strong p-type behavior (i.e. positive Seebeck coefficients in excess of 0.5 millvolt/° C) from those having lower p-conductivity characteristics.

Figure 6:
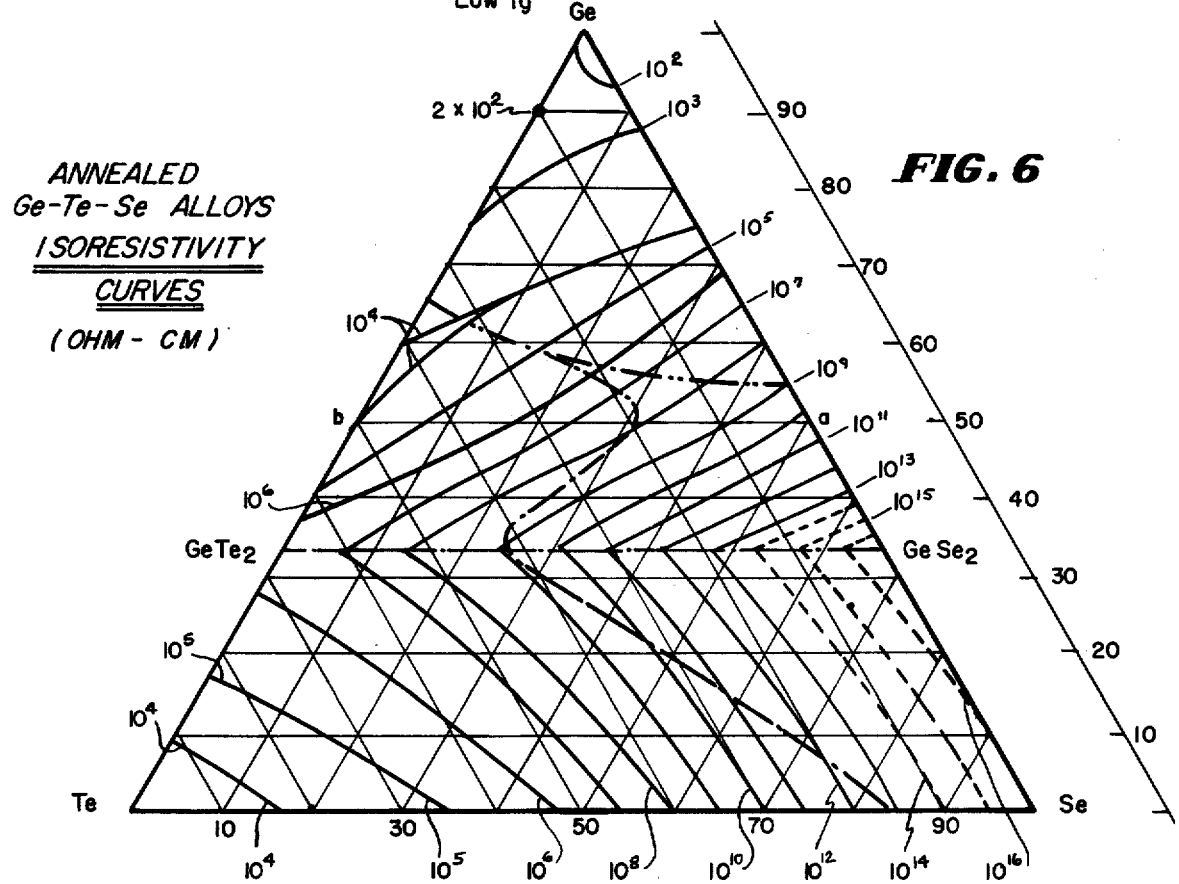
FIG. 6 is a diagram corresponding to FIG. 5 showing the various iso-resistivity lines from the annealed compositions of FIG. 5.

FIG. 6 indicates the iso-resistivity lines for the compositions of FIG. 5, and it will be noted that the various iso-resistivity lines have moved upwardly from their position in FIG. 2 where they were in their unannealed state, which is consistent with FIG. 3 which shows a reduction in conductivity as a result of the annealing operation.

Figure 11:
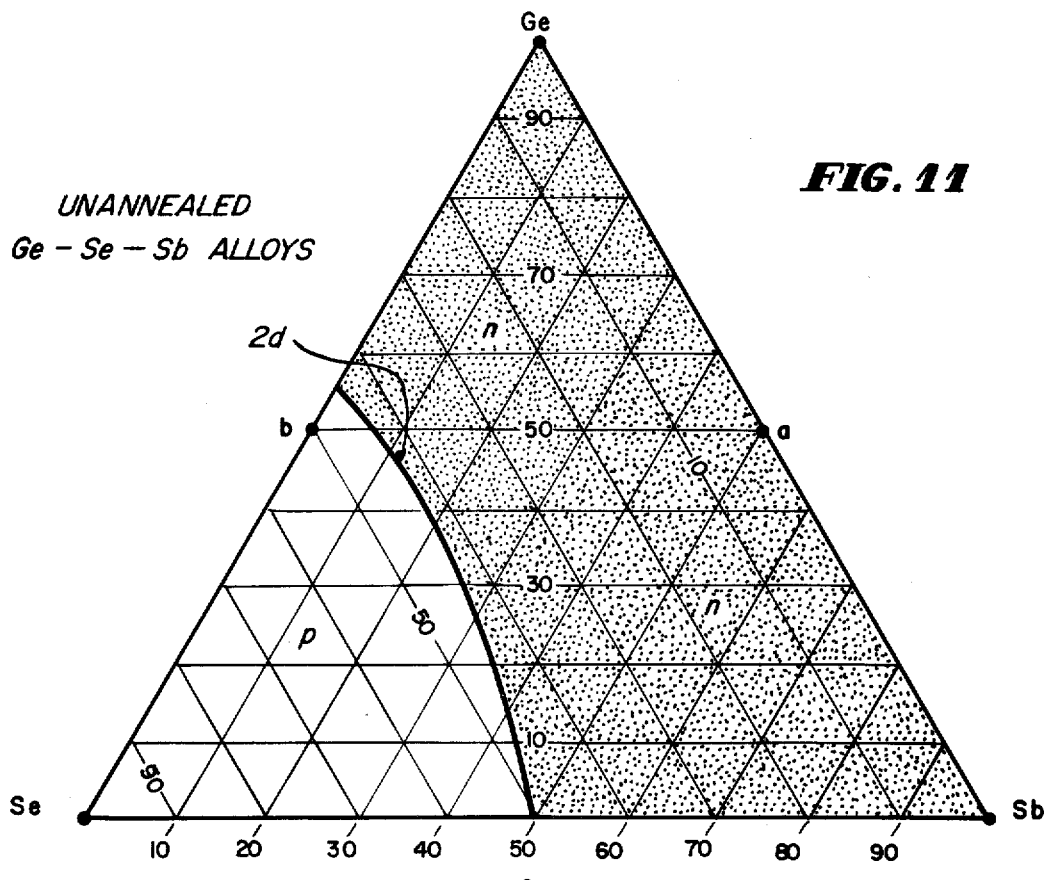
FIG. 11 is a ternary diagram for germanium, selenium and antimony compositions and shows in the stippled areas thereof those compositions which have an n-conductivity type in the unannealed state thereof.

Arsenic (As) can be added to the Ge-Te-Se and Ge-Se-Sb alloys disclosed in FIGS. 5 and 11 to provide amorphous films having n-type behavior. Amorphous arsenic itself is n-type both before and after annealing. As further examples, consider the following amorphous alloy films, which are outlined in three categories:

A. GeTe is p-type in both the unannealed and the highly-annealed states. GeTeAs is also p-type in the unannealed state but is n-type in the highly-annealed state. Arsenic is n-type in both the unannealed and highly annealed states. Any intermediate composition between GeTe and As can be fabricated and the p-type or n-type behavior progresses continuously from that described above for GeTe, through that described for GeTeAs, to that described for As.

B. GeSe is p-type in the unannealed state and n-type in the annealed state. GeSeAs is just barely n-type in the unannealed state and distinctly n-type in the highly-annealed state. Arsenic, as described above, is distinctly n-type in both the unannealed and highly annealed states. Any intermediate composition between GeSe and As can be fabricated and the p-type or n-type behavior progresses continuously from that described above for GeSe, through that described for GeSeAs, to that described for As.

C. Amorphous four-component alloys containing any arbitrary percentages of the elements Ge, Te, Se or As can be fabricated and will have n or p-type behavior depending upon their composition and upon their annealing state. A guide to this behavior is indicated by the above description for Ge-Te-As alloys and GeSe-As alloys and the description for Ge-Te-Se alloys as indicated in FIGS. 1 and 2. For example, if an arbitrary proportion of Ge, Te and Se constituents is selected from the Ge-Te-Se ternary system, addition of arsenic to this alloy will increase the likelihood of n-type behavior beyond the regions shown as n-type in FIG. 5. As a specific example, $Ge_2TeSeAs_2$ is p-type in the unannealed state and n-type in the highly annealed state. A feature of adding arsenic to those Ge-Te-Se alloys which are on the Se-rich side of the ternary (for example, near GeSe and $GeSe_2$) is that addition of arsenic reduces the resistivity while maintaining the n-type behavior. The addition of arsenic to tellurium rich materials such as GeTe or $GeTe_2$ increases the resistivity however.

Generally, antimony is similar in effect to that of arsenic but does not have as strong an n-type tendency. For example, unannealed GeSe is moderately p-type while unannealed GeSeSb is n-type. Also, annealed GeTe is strongly p-type whereas annealed GeTeSb is weakly p-type. These two examples show that antimony does increase the n-type tendency of a Ge-Te or Ge-Se alloy.

FIGS. 7 and 8 confirm the general principle that many different amorphous chalcogenide compositions can be converted from p-type to n-type materials using an annealing process like that previously described or by otherwise elevating the temperature thereof to a point where it falls within the region where the conductivity decreases with increase in annealing temperature. Thus, FIGS. 7 and 8 show the different n and p compositions for two or three element alloys comprising germanium, tellurium and arsenic, the hatched areas in FIG. 8 showing the p-type unannealed compositions of FIG. 7 which are converted to n-type materials by an annealing process like that described. The boundary lines 2b and 2b' respectively in FIGS. 7 and 8 separate the n and p compositions.

FIGS. 9 and 10 show the different n and p compositions for two or three element alloys comprising germanium, selenium and arsenic, the hatched areas in FIG. 10 showing the p-type unannealed compositions of FIG. 9 which are converted to n-type materials by an annealing process like that described. The boundary lines 2c and 2c' respectively in FIGS. 9 and 10 separate the n and p type compositions.

Figure 12:
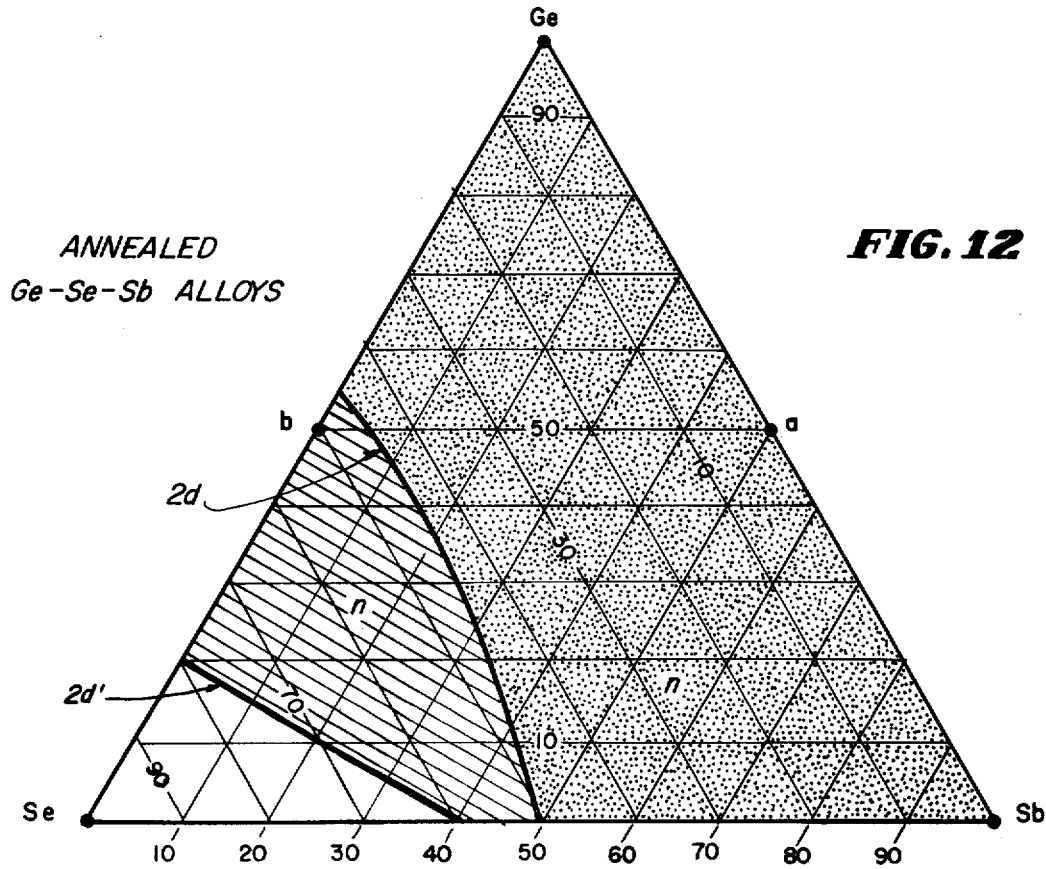
FIG. 12 is a ternary diagram corresponding to FIG. 11 and shows in the hatched areas thereof those compositions which are converted to an n-conductivity state in accordance with the annealing process of the invention.

FIGS. 11 and 12 show the different n and p compositions for two or three element alloys comprising germanium, selenium and antimony, the hatched areas of FIG. 12 showing the p-type unannealed compositions of FIG. 7 which are converted to n-type materials by an annealing process like that described. The boundary lines $2d$ and $2d'$ respectively in FIGS. 11 and 12 separate the n and p type compositions.

Selenium can be partially or completely replaced by sulfur in the compositions of FIGS. 5, 9 and 11. If selenium were replaced by sulfur in FIG. 5, the boundaries between n and p regions would shift somewhat, but the general results are similar, particularly if the sulfur content is less than about 80%. However if the sulfur content is as high as 90 or 100%, the results will be much different than those for 90 or 100% selenium.

As previously indicated, one of the main applications of the new n-type compositions of the present invention and previously unknown but presently discovered n-type chalcogenide compositions are in p-n junction devices like rectifiers and transistor-type devices and the like which, heretofore, have been primarily doped crystalline semiconductor devices which are difficult to fabricate and are affected by radiation. With the discovery and development of n-type amorphous chalcogenide materials it is possible by film deposition to make current control devices like rectifiers and amplifiers on an inexpensive mass production basis. N-type layers of such devices may be selected from the various n-type compositions referred to in this specification and p-type layers in such devices can also be selected from those materials described above or from other p-type amorphous semiconductor materials. Examples of such other p-type amorphous semiconductor materials include $As_2Te_3Tl_2Te$, $As_2Te_3Tl_2Se$, $As_2Te_3$, $As_2Se_3$, $Te_{48}As_{30}Si_{12}Ge_{10}$ and $Ge_{15}Te_{81}Sb_2S_2$. A large and continuous range of optical band gaps, as well as resistivities, is available for both p and n type materials.

Figure 13A:
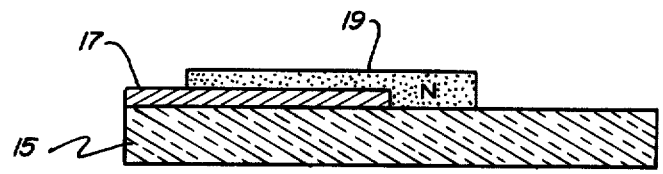
FIGS. 13A and 13B show the steps in the preparation of an n-p junction current control device by successive deposition of amorphous chalcogenide layers with an annealing treatment applied to one of the layers to provide an n-conductivity type layer.
Figure 13B:
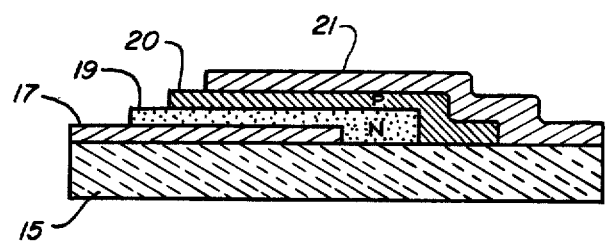

The p-n current device can also be formed with p-n type layers of identical composition but formed in a different way, as exemplified by the process shown in FIGS. 13A and 13B to which reference should now be made. FIG. 13A shows a substrate 15, which may be any suitable substrate material like glass or a semiconductor silicon chip substrate, upon which is deposited one or more layers of conductor material forming electrodes, like the electrode-forming layer 17 in FIG. 13A. Upon this electrode-forming layer 17 and the substrate on one side thereof is sputter deposited a layer 19 of initially n-type or an initially p-type chalcogenide glass material which is converted to an n-type material by the annealing process described. A p-type layer 20 of amorphous semiconductor material is deposited over the n-type layer 19 and the substrate on one side thereof. An electrode-forming layer 21 is then deposited over the p-type layer to form the second electrode of a two terminal rectifier device. The electrode-forming layers 17 and 21 can be comprised of any one or more well-known electrode materials which are preferably refractory metals like molybdenum used as electrodes in chalcogenide glass semiconductor switches. These electrode materials may be overlaid with aluminum or the like (not shown), or other commonly used highly conductive terminal-forming materials.

Figure 14A:
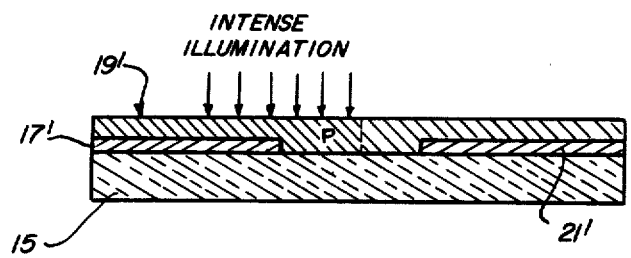
FIGS. 14A and 14B show a process of fabricating an n-p junction current control device by depositing only a single layer of a p-type chalcogenide glass and subsequently irradiating a selected portion thereof to form an n-conductivity type region therein.
Figure 14B:
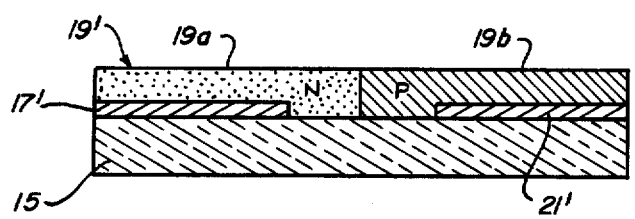

FIGS. 14A and 14B show another technique for forming p-n junction current control devices in accordance with the method aspects of the present invention. As there shown, a substrate 15 has applied thereto spaced electrodes 17' and 21' upon which is preferably sputter-deposited a p-type amorphous chalcogenide material like those previously described. The amorphous chalcogenide layer 19' overlays the electrodes 17' and 21' and fills the gap therebetween. Then, a portion of the amorphous chalcogenide layer 19' between the space edges of the electrodes 15' and 17' may be irradiated with a beam from a laser or other suitable intense light source, which raises the temperature of the radiated portion to one which will anneal the material to a point where it will be converted to an n-type material as previously described, thereby forming a p-n junction current control device.

Figure 15:
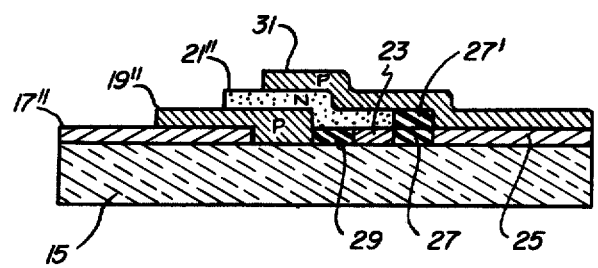
FIG. 15 illustrates the successively applied layers of a p-n-p junction current control device with associated electrodes which can be fabricated by the film deposition techniques of the present invention.

FIG. 15, to which reference should now be made, shows a three terminal p-n-p current control amplifier device analogous to a transistor. The glass or other substrate 15 has initially applied thereto three spaced electrode-forming layers 17", 23 and 25. A layer of insulating material 27, which can be silicon dioxide especially when the substrate 15 is a silicon chip, is applied in the space between the electrode-forming layers 23 and 25 and an insulation layer 29 is deposited on the side of the electrode-forming layer 23 facing the electrode-forming layer 17", leaving a gap between layer 29 and layer 17". Then an amorphous p-type material 19" may be deposited over the electrode-forming layer 17" and in the gap between the latter layer and the insulating layer 29. Next, a layer 21" of chalcogenide glass material is applied over the p-type layer 19" which layer 21" extends over the insulating layers 29 and the electrode-forming layer 23. An insulating layer 27' is then deposited over the insulating layer 27 to insulate the adjacent edge of the just deposited chalcogenide glass layer 21" and the electrode-forming layer 25. The initially deposited layer 21" is in a p-conductivity state which can be converted by annealing to an n-type material at a temperature which is below that which will convert the layer 19" to an n-type material if the latter is of a type which can be annealed into an n-type material.

Lastly, a p-type amorphous layer 31 is deposited over the n-type layer 21" so the layer 31 overlaps the insulating layer 27' and the electrode-forming layer 25. The electrode-forming layer 17", 23 and 25 act respectively as connecting electrodes to the respective p-n-p layers 19", 21" and 31.

It should be apparent that the present invention has materially advanced the art of fabricating current control devices using n-type amorphous films in one or more layers of the current control devices involved. Also, new n-type compositions have been developed as a result of the method aspects of the present invention that have great commercial value.

It should be understood that numerous modifications may be made of the more preferred form of the invention described without deviating from the broader aspects of the invention.

We claim:

1. An n-type chalcogenide amorphous material as measured by the Seebeck coefficient, said n-type material being that obtained by subjecting a normally p-type amorphous chalcogenide composition to a temperature below its crystallization temperature and which is located at a point on its room temperature versus annealing temperature curve which is sufficiently in excess of the temperature at which its conductivity at room temperature decreases sharply from a relatively high constant value that its Seebeck coefficient has a negative value, and then cooling the same to room temperature.

2. The n-type amorphous chalcogenide material of claim 1 and where the composition has at least about 2% of one or more of the chalcogenide elements of sulfur, selenium and tellurium and has the formula:

$$Ge_xTe_yD_zE_m$$

where,
Ge=germanium
Te=tellurium
D=selenium or sulfur or combinations of both
E=arsenic or antimony or combinations of both
and,
$x$ is between and including 0 and 98% (atomic)
$y$ is between and including 0 and 90%
$z$ is between and including 0 and 75%
$m$ is between and including 0 and 98%.

3. The n-type chalcogenide material of claim 1 which consists essentially of a mixture of germanium, selenium and tellurium in atomic percentages determined by the areas hatched in FIG. 5.

4. The n-type chalcogenide material of claim 3 which consists essentially of a mixture of germanium, selenium and tellurium in atomic percentages determined by the areas encompassed by the inclined hatched areas of FIG. 5.

5. The n-type chalcogenide material of claim 1 which consists essentially of a mixture of germanium, tellurium and arsenic in atomic percentages determined by the areas hatched in FIG. 8.

6. The n-type chalcogenide material of claim 1 which consists essentially of a mixture of germanium, selenium and arsenic in atomic percentages determined by the areas hatched in FIG. 10.

7. The n-type chalcogenide material of claim 1 which consists essentially of a mixture of germanium, selenium and antimony in atomic percentages determined by the areas hatched in FIG. 12.

8. The n-type chalcogenide material of claim 1 which is a sputter or vapor deposited film on a substrate.

9. The n-type chalcogenide material of claim 2 which is a sputter or vapor deposited film on a substrate.

10. The n-type chalcogenide material of claim 4 which is a sputter or vapor deposited film on a substrate.

* * * * *